(12) United States Patent
Preischel et al.

(10) Patent No.: US 10,422,821 B2
(45) Date of Patent: Sep. 24, 2019

(54) SYSTEM AND METHOD OF IDENTIFYING A MODULE IN A STACK LIGHT

(71) Applicant: Rockwell Automation Technologies, Inc., Mayfield Heights, OH (US)

(72) Inventors: Will J. Preischel, Racine, WI (US); John P. Caspers, Racine, WI (US); Patrick K. Duffy, Greenfield, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 150 days.

(21) Appl. No.: 15/489,289

(22) Filed: Apr. 17, 2017

(65) Prior Publication Data
US 2018/0299370 A1    Oct. 18, 2018

(51) Int. Cl.
| | |
|---|---|
| *G01N 21/27* | (2006.01) |
| *H05K 1/18* | (2006.01) |
| *H05K 5/00* | (2006.01) |
| *H05K 5/02* | (2006.01) |
| *G01J 3/50* | (2006.01) |
| *G01N 27/72* | (2006.01) |
| *G01R 19/00* | (2006.01) |
| *H05K 1/14* | (2006.01) |
| *H05K 1/11* | (2006.01) |

(52) U.S. Cl.
CPC ..... *G01R 19/0092* (2013.01); *G01R 19/0084* (2013.01); *H05K 1/142* (2013.01); *H05K 1/117* (2013.01); *H05K 2201/1034* (2013.01); *H05K 2201/10151* (2013.01)

(58) Field of Classification Search
CPC ......... G01N 21/27; G01N 27/72; G01J 3/505; G01R 19/0084; G01R 19/0092; H05K 5/0247; H05K 1/181; H05K 5/0021; H05K 2201/10151
USPC ............................................ 324/207.26, 227
See application file for complete search history.

(56) References Cited

U.S. PATENT DOCUMENTS

| | | |
|---|---|---|
| 3,739,096 A | 6/1973 | Iding |
| 5,952,915 A | 9/1999 | Marquardt et al. |
| 6,632,003 B2 | 10/2003 | Marquardt et al. |
| 7,545,284 B2 | 6/2009 | Neumann et al. |

(Continued)

FOREIGN PATENT DOCUMENTS

| | | |
|---|---|---|
| DE | 19513983 A | 10/1995 |
| DE | 10041202 A1 | 3/2002 |

(Continued)

*Primary Examiner* — Huy Q Phan
*Assistant Examiner* — Zannatul Ferdous
(74) *Attorney, Agent, or Firm* — Boyle Fredrickson, SC

(57) ABSTRACT

A system to verify the identity of modules within a stack light is disclosed. A sensor is mounted to a circuit board inserted within a housing of the module, and a target is mounted to or integrally formed in the housing. The sensor detects and generates a signal corresponding to the detected target. Different targets or locations for the target are provided for each housing. The module, a base for the stack light, or a remote controller in communication with the stack light identifies the housing in which the circuit board is mounted based on the feedback signal generated by detecting the target. At power-up, a routine may initiate a verification routine by which each module in the stack light determines the type of housing in which the circuit board for that module is located.

23 Claims, 12 Drawing Sheets

(56) References Cited

U.S. PATENT DOCUMENTS

| | | | |
|---|---|---|---|
| D673,476 S | 1/2013 | Clore | |
| D684,079 S | 6/2013 | Clore | |
| 2003/0030567 A1 | 2/2003 | Hetzel et al. | |
| 2004/0066142 A1 | 4/2004 | Stimac et al. | |
| 2004/0166743 A1 | 8/2004 | Kurose et al. | |
| 2006/0044814 A1 | 3/2006 | Ikeda | |
| 2008/0242408 A1* | 10/2008 | Hwang | G07F 17/3202 463/31 |
| 2009/0267519 A1 | 10/2009 | Pearse | |
| 2013/0314916 A1 | 11/2013 | Clore | |
| 2014/0138519 A1* | 5/2014 | Wang | G01S 17/89 250/206.1 |
| 2016/0203686 A1 | 7/2016 | Auer et al. | |
| 2018/0007343 A1* | 1/2018 | Send | G01S 17/46 |
| 2018/0172853 A1* | 6/2018 | Newman | G01T 5/02 |

FOREIGN PATENT DOCUMENTS

| | | |
|---|---|---|
| DE | 10058695 A | 5/2002 |
| DE | 202013102472 U1 | 6/2013 |
| EP | 1460332 A2 | 9/2004 |
| EP | 2182776 A1 | 5/2010 |
| JP | H07282605 A | 10/1995 |

* cited by examiner

SYSTEM AND METHOD OF IDENTIFYING A MODULE IN A STACK LIGHT

BACKGROUND INFORMATION

The present invention relates to stack lights, which convey visual and/or audible information regarding operating and/or fault conditions in an industrial environment, and in particular, to a stack light that includes a system for identifying the type of module present at each location within the stack configuration.

Stack lights are typically constructed of modular components that may be flexibly interconnected to produce stacks having varying combinations, orders, numbers, and configurations of modules. The modules may have various configurations and may include, for example, beacon modules emitting different colors of light, audible modules emitting different tones or sounds, or power modules receiving input power at one voltage and supplying power to the different modules at one or more different voltage levels. Although each module may provide a different function, they typically utilize identical mechanical and electrical connectors such that one module may be connected or stacked on another module. Unique base and/or terminating modules may be employed to provide a first or last module in the stack light, respectively.

A stack light may include different colored lamps and may be attached, or placed in close proximity, to operating industrial equipment to provide a visible indication of the equipment operating status. An audible module may also be provided to provide an audible indication of operating status. The tower structure provides visibility of the beacon lights over a range of angles and locations in the operating environment. Different colors of the lights allow multiple types of information to be communicated at a distance in a possibly noisy environment. For example, a red light may indicate a machine failure or emergency. A yellow light may indicate a warning such as an over-temperature or over-pressure condition. A green light may indicate proper machine operation. Further, the lights may be illuminated as a continuous or flashing light to provide still additional information related to the operation of the machine.

Control signals are provided to each module in the stack light to provide desired operation of the module. The control signals may be generated by an external controller, such as a programmable logic controller (PLC), or by wiring directly to devices on the controlled machine or process.

For example, a proximity switch may close and generate a signal when an access gate is closed. A complementary signal may be generated when the access gate is opened. The stack light may include a first beacon module with a green translucent housing and a second beacon module with a red translucent housing. The gate closed signal may be provided to the first beacon module and be intended to illuminate the green beacon module when the access gate is closed. The complementary, gate open signal may be provided to the second beacon module and be intended to illuminate the red beacon module when the access gate is open. Thus, an operator may readily identify whether the access gate is open or closed, which, in turn may indicate whether the machine is safe to operate.

While modularity of the stack light construction is intended to provide a customer with the ability to rapidly fabricate a wide variety of different stack light configurations out of readily available (stocked) components, the large number of configurations, however, can lead to an error in assembly. For example, because the modules are interchangeable, it is possible that the order in which the two exemplary beacon modules discussed above are switched during assembly. The gate open and closed signals, if wired to the correct terminals, would illuminate the incorrect beacons. As a result, the green beacon module would be illuminated when the access gate is open and the red beacon module is illuminated when the access gate is closed.

Thus, it would be desirable to provide a system to verify the identity of modules within a stack light.

BRIEF DESCRIPTION

The subject matter disclosed herein describes a system to verify the identity of modules within a stack light. A sensor is mounted to a circuit board inserted within a housing of the module. A target is mounted to or integrally formed in the housing. When the circuit board is inserted into the housing, the sensor detects the target and generates a signal corresponding to the detected target. Different targets or locations for the target are provided for each housing such that a different signal is generated for each housing. An electric circuit on the circuit board may determine in which housing the circuit board is mounted based on the feedback signal or, alternately, the electric circuit may pass the feedback signal to another module, such as a base module for the stack light, or to a controller, such as a programmable logic controller (PLC), in communication with the stack light. The other module or the PLC may then identify the housing in which the circuit board is mounted based on the feedback signal.

At power-up, a routine in the electric circuit either within each module or within the base module initiates a verification routine by which each module in the stack light determines the type of housing in which the circuit board for that module is located. The information may be stored in the memory on the stack light for subsequent polling or transmitted back to a PLC where correct configuration may be verified.

According to one embodiment of the invention, a system for identifying a module in a stack light is disclosed, where the stack light includes at least a first module and a second module. A first sensor is mounted within a first housing of the first module, and a first target is mounted to the first housing. The first sensor is configured to detect the first target and to generate a first signal identifying the first module responsive to detecting the first target. A second sensor is mounted within a second housing of the second module, and a second target is mounted to the second housing. The first sensor and the second sensor are the same type of sensor. The second sensor is configured to detect the second target and to generate a second signal identifying the second module responsive to detecting the second target. The second target is different than the first target such that the second signal is different than the first signal.

According to another aspect of the invention, the system includes a first and second circuit board. The first circuit board includes a first electrical circuit in communication with the first sensor, and the first sensor is mounted to the first circuit board. The second circuit board includes a second electrical circuit in communication with the second sensor, and the second sensor is mounted to the second circuit board. The layout of the first circuit board is the same as the layout of the second circuit board.

According to still another aspect of the invention, the first sensor may be configured to detect a magnetic field, and the first signal may be generated responsive to a first magnetic field generated by the first target. The second sensor may be configured to detect a magnetic field, and the second signal may be generated responsive to a second magnetic field generated by the second target, where the second magnetic field is different than the first magnetic field.

According to yet another aspect of the invention, the first sensor may be configured to detect a color, and the first signal may be generated responsive to a first color present on the first target. The second sensor may be configured to detect a color, and the second signal may be generated responsive to a second color present on the second target, where the second color is different that the first color.

According to still another aspect of the invention, the first sensor may be a first electrical connector, and the first target may be a first electrical device, where the first signal is generated responsive to the first electrical connector establishing an electrical connection with the first electrical device. The second sensor may be a second electrical connector, and the second target may be a second electrical device, where the second signal is generated responsive to the second electrical connector establishing an electrical connection with the second electrical device. The second electrical device is different than the first electrical device.

According to yet another aspect of the invention, the first sensor may be a plurality of contact pairs mounted on the first circuit board, and the first target may be a plurality of electrically conductive strips on the first housing. The first signal is generated responsive to each electrically conductive strip on the first housing establishing an electrical connection between a first contact and a second contact in one of the contact pairs mounted on the first circuit board. The second sensor may be a plurality of contact pairs mounted on the second circuit board, and the second target may be a plurality of electrically conductive strips on the second housing. The second signal is generated responsive to each electrically conductive strip on the second housing establishing an electrical connection between a first contact and a second contact in one of the contact pairs mounted on the second circuit board. The electrically conductive strips on the first housing are different than the electrically conductive strips on the second housing.

According to still another embodiment of the invention, a method of identifying a module in a stack light is disclosed, where the stack light includes at least a first module and a second module. A first target mounted to the first housing is detected with a first sensor, where the first sensor is mounted within the first housing, and a first signal identifying the first module is generated with the first sensor responsive to detecting the first target. A second target mounted to the second housing is detected with a second sensor, where the second sensor is mounted within the second housing, and a second signal identifying the second module is generated with the second sensor responsive to detecting the second target. The second target is different than the first target such that the second signal is different than the first signal.

According to still another embodiment of the invention, a system for identifying a module in a stack light is disclosed, where the stack light includes a first beacon module, a second beacon module, and a base module. The first beacon module includes a first sensor, a first target, and a first circuit board. The first sensor is mounted to the first circuit board within a first housing of the first module, and the first circuit board includes a first electrical circuit in communication with the first sensor. The first target is mounted to the first housing, and the first sensor is configured to detect the first target and to generate a first signal identifying the first module responsive to detecting the first target. The second beacon module includes a second sensor, a second target, and a second circuit board. The second sensor is mounted to the second circuit board within a second housing of the second module, and the second circuit board includes a second electrical circuit in communication with the second sensor. The second target is mounted to the second housing, and the second sensor is configured to detect the second target and to generate a second signal identifying the second module responsive to detecting the second target. The first sensor and the second sensor are the same type of sensor, and the second target is different than the first target such that the second signal is different than the first signal. The base module includes a non-volatile memory device and a microprocessor. The non-volatile memory device is configured to store a plurality of instructions and to store an identity of each of the first and second beacon modules. The microprocessor in the base module is configured to execute the plurality of instructions to control the first and second sensors to identify the first and second modules.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
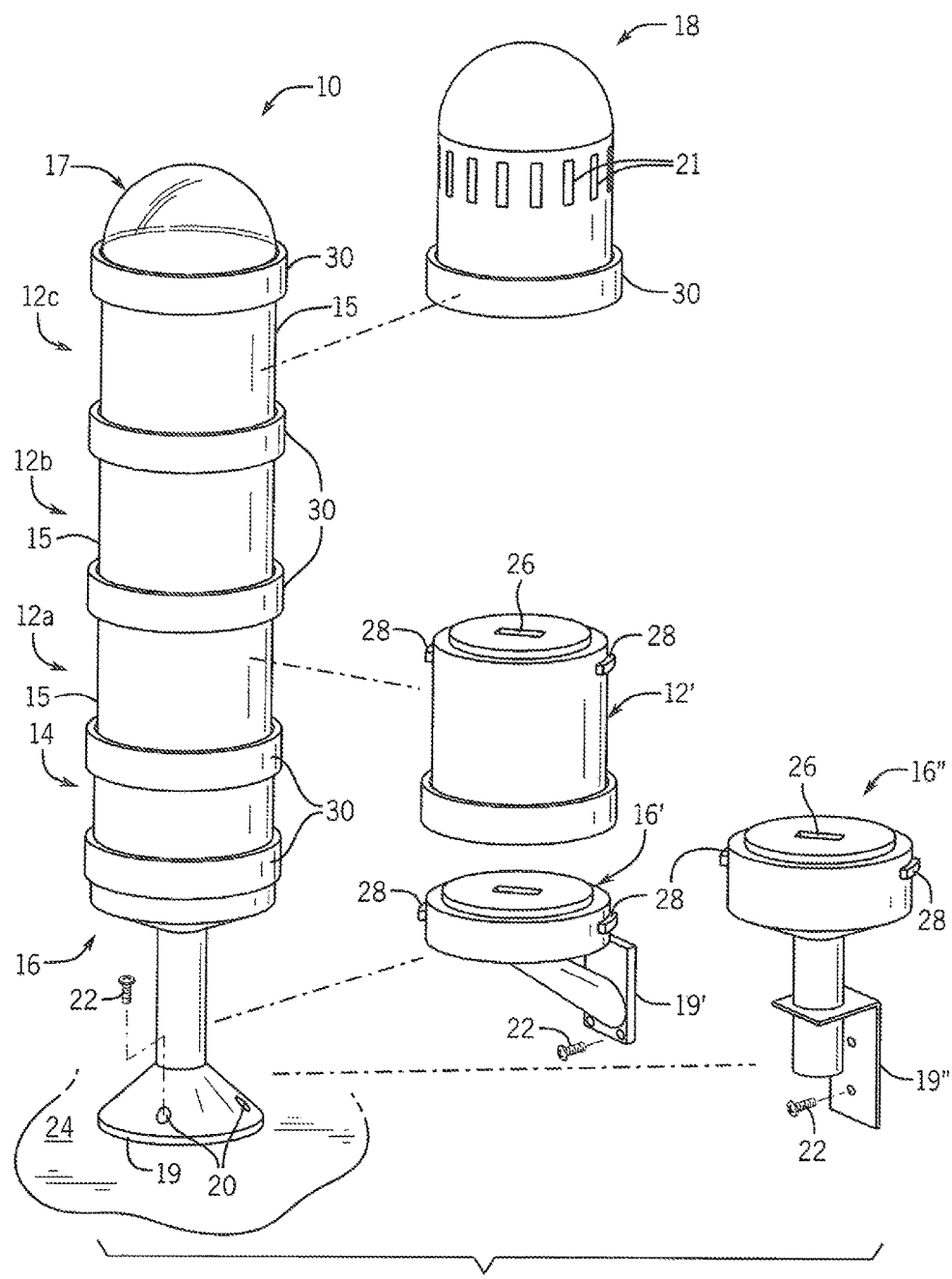
FIG. 1 is a perspective view of a stack light assembled of several beacon modules, a power-converter/function module and a base module, juxtaposed with alternative unassembled modules.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Referring now to FIG. 1, a stack light 10 incorporating the present invention may be assembled of multiple interlocking beacon modules 12a, 12b, 12c, a power-converter/function module 14, and a base module 16. An optional audio module 18 is illustrated which may replace one of the beacon modules 12c or may be added in line with the stack as an additional module. According to the illustrated embodiment, a dome 17 is provided on the top of the stack light 10 to provide an upper termination module.

In one embodiment, the base module 16 may provide a lower flange 19 having one or more openings 20 for receiving machine screws 22 or the like to fasten the flange 19 and hence the base module 16 to a surface 24 of a machine or the like. Alternative base module 16' and 16" may provide for different flanges 19' and 19", respectively, (for example, for mounting to vertical surfaces) or for accommodating different base constructions.

The upper surface of the base module 16 may expose a centered electrical connector 26 (visible in FIG. 1 only on base module 16' and 16") that may be received by a corresponding electrical connector 26 (not visible in FIG. 1) on the lower surfaces of each of the other modules. Similar connectors 26 exist on the upper surface of each of the other modules for connection to each subsequently stacked module (visible in FIG. 1 only on beacon module 12'). Inter-engagement of these electrical connectors 26 in the assembled stack light 10 provide electrical communication between the base module 16, beacon modules 12, power-converter/function module 14 and audio module 18 as will be described.

The upper end of the base module 16 may also provide a mechanical interlocking system to a complementary connector provided toward the lower surface of each of the other modules. According to the embodiment illustrated in FIG. 1, radially extending tabs 28 (visible in FIG. 1 only on base module 16' and 16") are provided on the upper end of the base module 16. These radially extending tabs 28 may be received by the complementary portion of the mechanical interlocking system in the form of twist type bayonet rings 30 rotatably affixed to the lower surfaces of each of the other modules 12. Such bayonet rings 30, as generally understood in the art, provide features on their inner diameter that may capture the radially extending tabs 28 against a helical flange in the manner of inter-engaging threads while providing a slight pocket at the end of the rotation defining a detent that locks the tabs 28 and bayonet rings 30 into predetermined compression. Similar radially extending tabs 28 exist at the upper end of each of the other modules for engagement by a bayonet ring 30 on each of the subsequently stacked modules.

Figure 3:
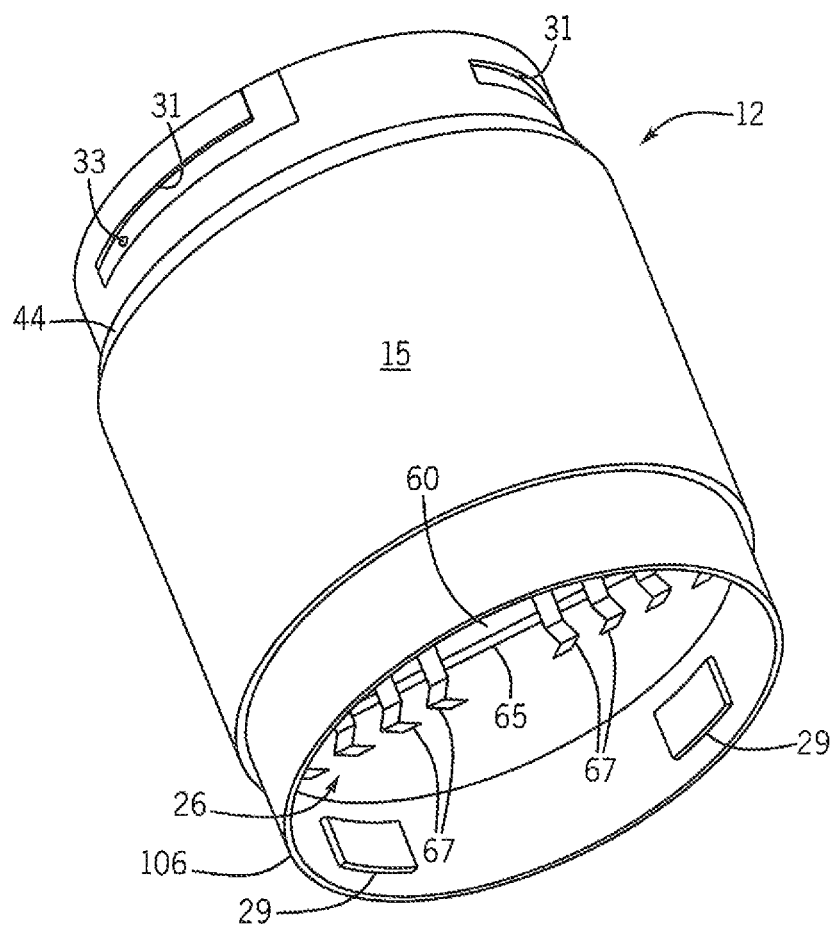
FIG. 3 is an isometric view of one embodiment of a beacon module for use in the stack light of FIG. 1.

According to another embodiment of the invention illustrated in FIG. 3, inwardly extending tabs 29 may be provided on the lower end of a module 12. The outer periphery of the upper end of each module 12 may include a complementary slot 31. The slot 31 is generally L-shaped, such that the inwardly extending tabs 29 may be inserted from the top with a lateral motion and then one module 12 rotated with respect to the other module such that the tabs 29 slide within the slot 31 around the outer periphery of the housing 15 to the end of the slot 31. The end of the slot 31 may include a detent in the upper surface in which the tab 29 is received. Optionally, a retaining member 33 may be provided within the slot 31, where the retaining member may be, for example, a small outward protrusion over which the tab 29 must pass. The interference from the retaining member 33 provides sufficient force to prevent inadvertent separation of the modules 12 but allows the tab 29 to rotate past. Optionally, the mating members may be reversed such that outwardly extending tabs may be located on the outer periphery of the upper end of each module 12 and complementary slots 31 may be formed on the inner surface at the lower end of each module.

As assembled in FIG. 1, the base module 16, the power-converter/function module 14 and the beacon modules 12 provide a stack light 10 extending generally upward from the base module 16 through the power-converter/function module 14 and then through one or more beacon modules 12, each of which may be independently controlled to display a predetermined color illumination. The tower may be capped by a plastic dome 17 also having a bayonet ring 30 but no electrical connector 26. Alternatively, an audio module 18, which may be independently controlled may provide an audible alert through sound ports 21 rather than an illuminated signal and may terminate the upper end of the stack light 10. Like the other modules, the audio alarm module 18 may include a bayonet ring 30 on its lower end for attachment to a lower module, and an electrical connector 26 on its lower surface for electrical interconnection to an earlier lower module. Desirably, the audio alarm module 18 may have a dome top without a connector 26 or tabs 28 on its top surface for attachment to later modules, thereby providing a finished appearance to the top of the tower.

Figure 2:
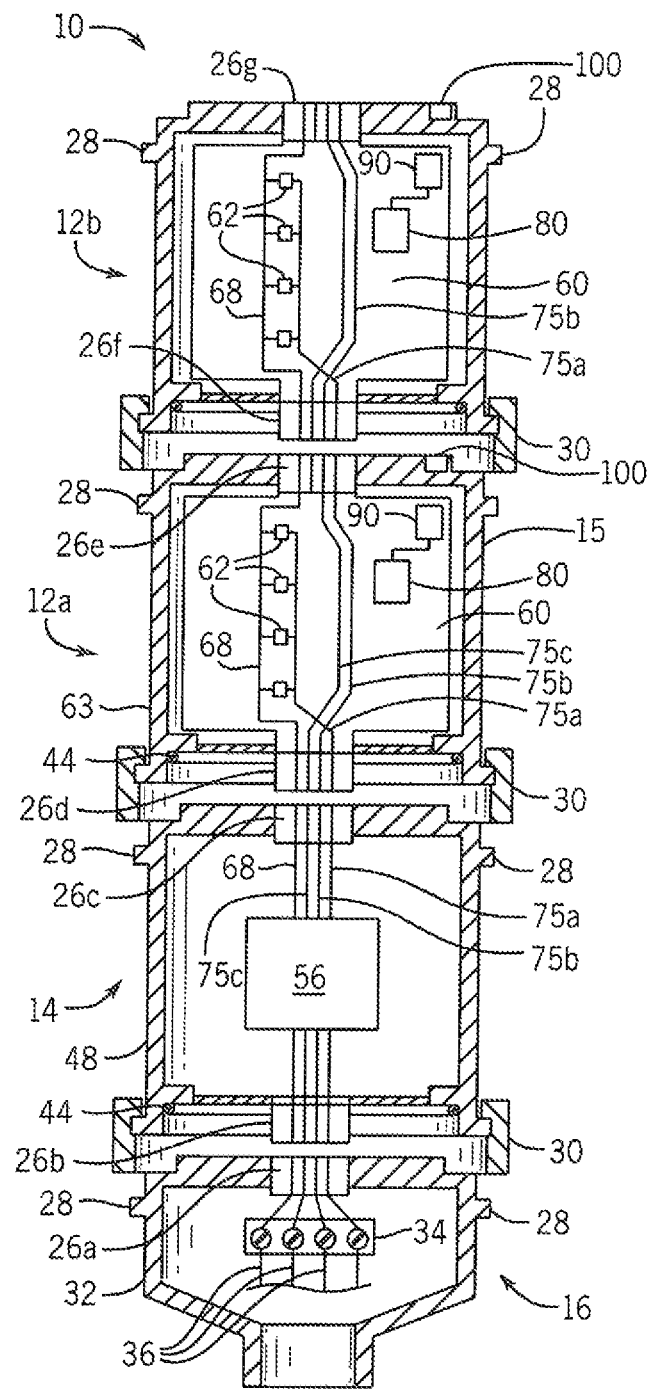
FIG. 2 is partial, exploded, sectional view of the stack light of FIG. 1 showing mechanical and electrical connection of the various modules.

Referring now to FIG. 2, base module 16 may provide a housing 32, for example, constructed of electrically insulating and opaque thermoplastic. The housing 32 may provide a cylindrical periphery in diameter generally matching the diameter of corresponding housings of the beacon modules 12, power-converter/function module 14 and audio alarm module 18. Standard diameters for stack lights 10 include 30 mm, 40 mm, 50 mm, 60 mm, 70 mm and 100 mm.

A terminal block 34 may be positioned within the housing 32 of the base module 16, for example, providing screw terminals, to receive conductors 36 from a remote switching device as will be discussed below. Each of the conductors 36, when attached to the terminal block 34, will be routed to the electrical connector 26a present at an upper surface of the base module 16. This electrical connector 26a receives a downwardly extending connector 26b from power-converter/function module 14 when it is connected to the base module 16. Electrical connectors 26a and 26b, for example, may be male and female components of the same connector to be mechanically inter-engageable or may be identical connectors reoriented as in the case of hermaphrodite connector systems.

Figure 4:
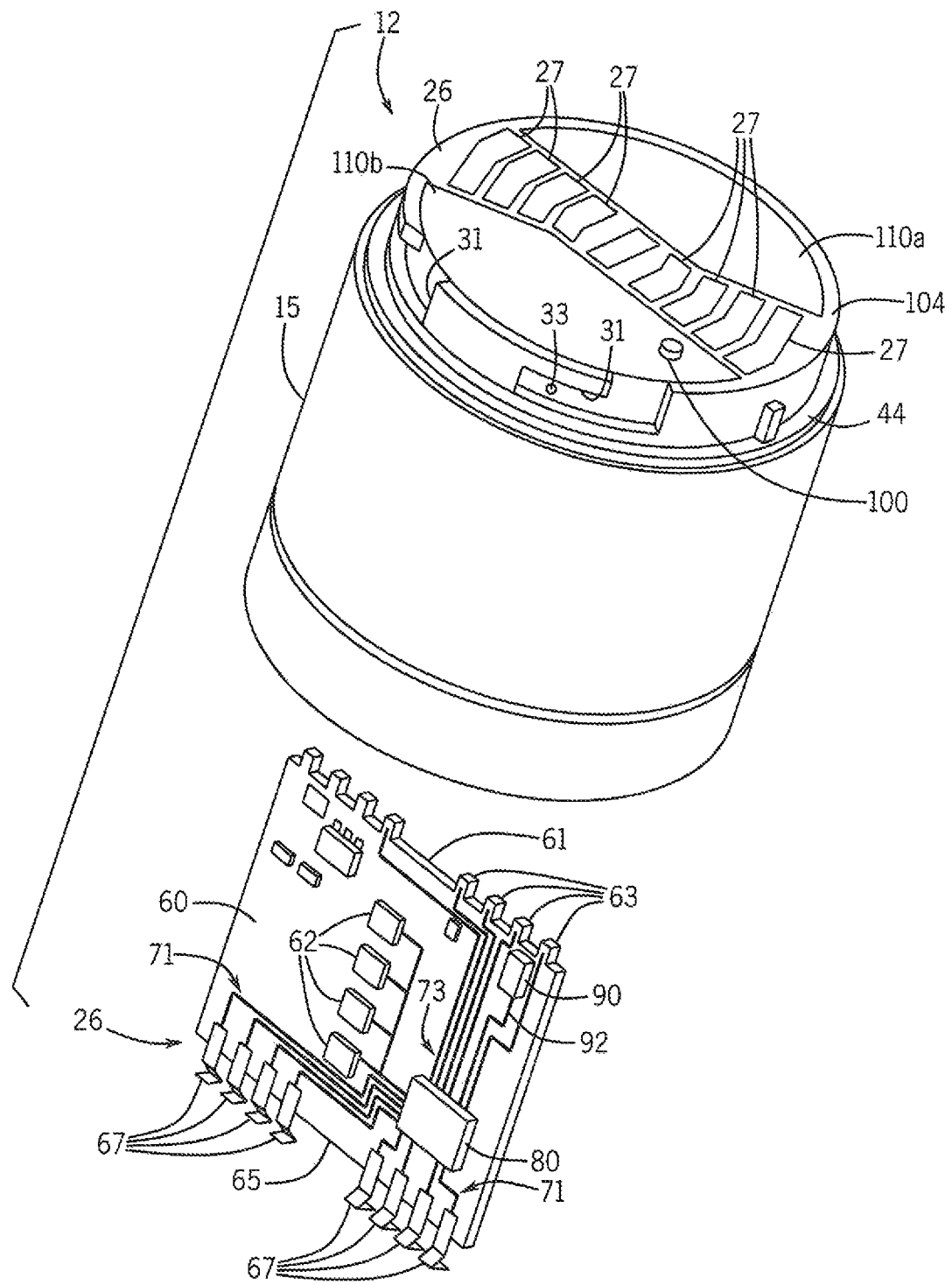
FIG. 4 is a partial exploded view of the beacon module of FIG. 3 illustrating one embodiment of the system to identify the module.

A illustrated in FIGS. 3 and 4, the electrical connectors 26 according to a first embodiment of the module 12 are illustrated. The electrical connector 26 on the upper surface 104 includes multiple slots 27 and multiple terminals 63 along an upper edge 61 of the circuit board 60. The electrical connector 26 on the lower end of the module 12 includes multiple terminals 67 along the lower edge 65 of the circuit board 60. The upper surface 104 of the housing 15 includes multiple slots 27 of varying lengths extending therethrough. The slots 27 are configured to receive terminals 67 along the lower edge 65 of the circuit board 60 from another module 12 and to allow rotation of the terminals 67 within the slots 27. Because the terminals 67 proximate the outer periphery will travel a greater distance than the terminals 67 in the center of the module for the same amount of rotation of the module, the length of the slots 27 along the outer periphery of the upper surface 104 are longer than the length of the slots 27 by the center of the upper surface 104. As two modules are rotated together, the lower terminals 67 of one module engage the upper terminals 63 of the other module. The lower terminals 67 are preferably constructed of a conductive and resilient material allowing deflection of the terminals during engagement. The lower terminals deflect in a direction orthogonal to the plane of the circuit board 60 as one module is rotated into the other. The resilient lower terminals 67 spring back to their original position when disengaged. The biasing force between the lower terminals 67 and the upper terminals 63 which caused the deflection while engaged establishes a good electrical connection between the terminals.

Figure 7:
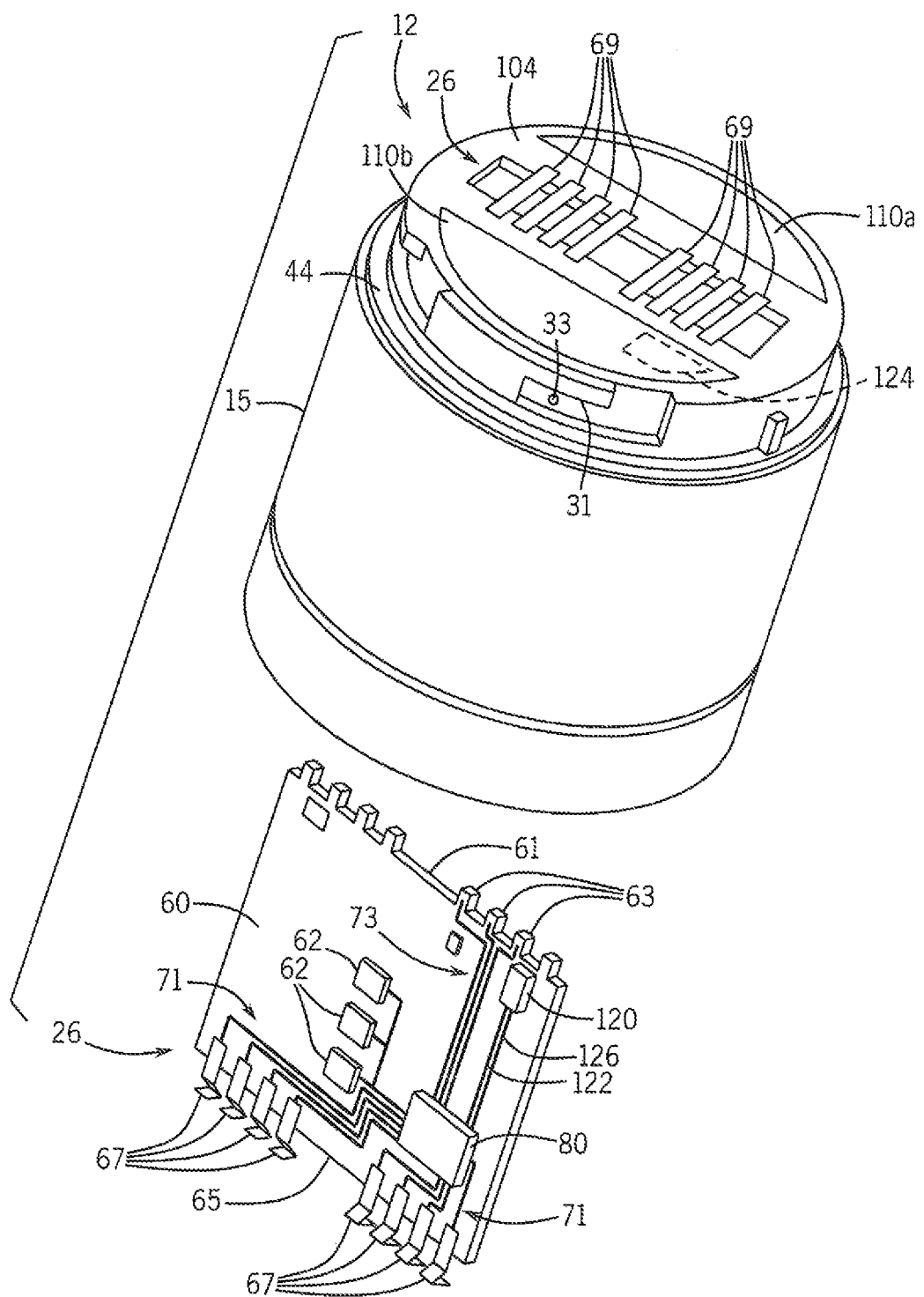
FIG. 7 is a partial exploded view of a beacon module for use in the stack light of FIG. 1 illustrating another embodiment of the system to identify the module.

As illustrated in FIG. 7, the electrical connectors 26 according to a second embodiment of the module 12 are illustrated. The electrical connector 26 on the upper surface 104 includes spring terminals 69 mounted to the upper surface 104 of the housing 15 and fixed terminals 63 along the upper edge 61 of the circuit board. The electrical connector 26 on the lower end of the module 12 includes multiple terminals 67 along the lower edge 65 of the circuit board 60. As two modules 12 are rotated together, the lower terminals 67 engage the spring terminals 69 causing downward deflection. When the two modules are rotated apart, the spring terminals 69 return to an upward, unbiased position. Either one or both ends of the spring terminals 69 are, in turn electrically connected to the fixed terminals 63 along the upper edge 61 of the circuit board. The biasing force between the spring terminals 69 of one module and the lower terminals 67 of the other module establishes a good electrical connection between the terminals.

Figure 10:
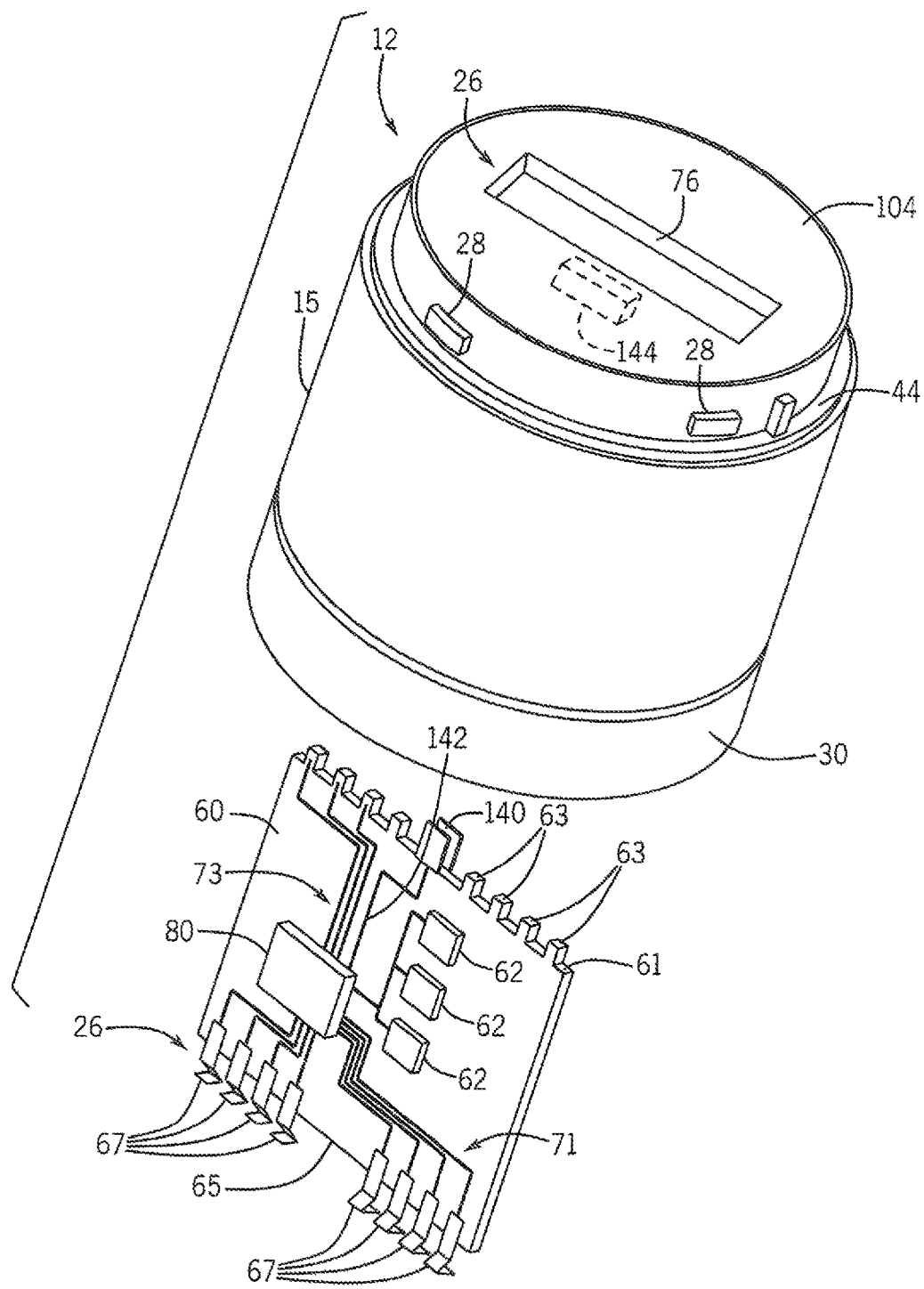
FIG. 10 is a partial exploded view of a beacon module for use in the stack light of FIG. 1 illustrating another embodiment of the system to identify the module.

As illustrated in FIG. 10, the electrical connectors 26 according to still another embodiment of the module 12 are illustrated. In the illustrated embodiment, it is contemplated that two modules are first press fit together, to establish an electrical connection and a bayonet ring 30 is rotated to establish a mechanical connection between modules. The electrical connector 26 on the upper surface 104 includes a slot 76 and terminals 63 along the upper edge 61 of the circuit board. The electrical connector 26 on the lower end of the module 12 includes terminals 67 along the lower edge 65 of the circuit board 60. As one module is inserted into the other, the terminals 67 along the lower edge 65 of one module extend through the slot 76 on the upper surface 104 and engage the terminals 63 of the other module. The lower terminals 67 are preferably constructed of a conductive and resilient material allowing deflection during engagement. The lower terminals are compressed toward the circuit board 60 as one module is inserted into the other. The resilient lower terminals 67 spring back to their original position when disengaged. The biasing force between the lower terminals 67 and the upper terminals 63 which caused the deflection while engaged establishes a good electrical connection between the terminals.

For simplicity, the electrical connectors 26a and 26b (and all connectors 26 in FIG. 2) are depicted with only four terminals (for example, conductive pins, sockets, or traces on circuit boards) which may be electrically connected to a separate conductor 36. As is understood in the art, each terminal provides an electrically independent conductive path within mating electrical connectors 26.

The mechanical connectors positively retain stacked modules to each other. According to the embodiment illustrated in FIG. 2, the upper edge of the base module 16 provides for radially extending tabs 28 that may be received by a bayonet ring 30 rotatably attached to the bottom of power-converter/function module 14. According to the embodiment illustrated in FIG. 3, the inwardly extending tabs 29 are received by the slots 31. By either embodiment, the base module 16 may be mechanically attached to the power-converter/function module 14 and electrical connectors 26a and 26b establish an electrical connection between the modules. An O-ring seal 44 may be provided at the junction between the upper surface of base module 16 and the lower surface of power-converter/function module 14 to reduce the ingress of environmental contamination when the two are connected. Each of the base module 16, power-converter/function module 14, beacon module 12, or audio module 18 within a stack light utilize a common set of mechanical connectors such that they are interchangeable and may be mounted to each other.

Referring still to FIG. 2, the power-converter/function module 14 may provide for an opaque housing 48. An electrical connector 26c may be located at its upper surface and be substantially identical to connector 26a and exposed to receive a connector 26d when beacon module 12a is attached to the upper surface of the power-converter/function module 14. As described above, this connection may be made by means of insertion and/or rotation of one connector to the other.

Figure 13:
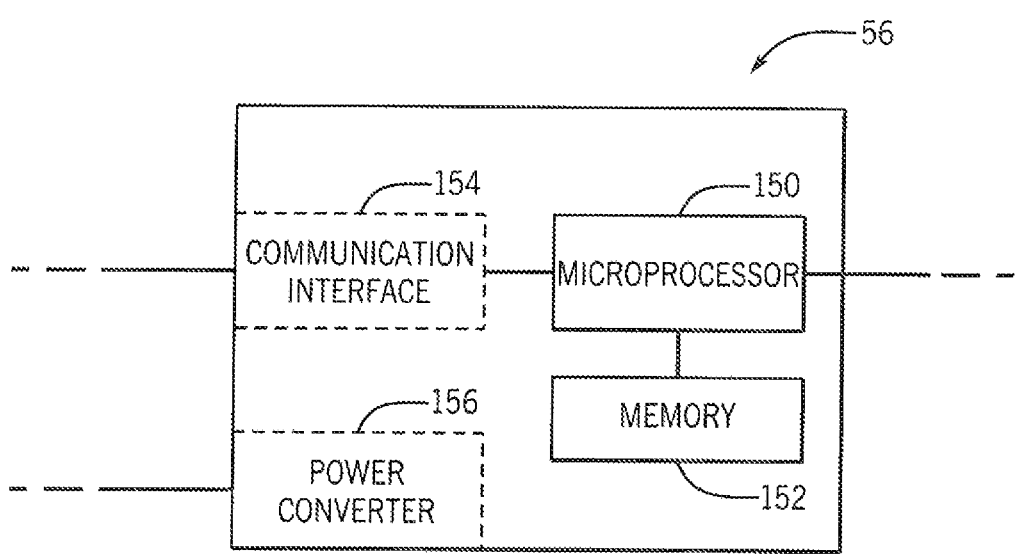
FIG. 13 is a block diagram representation of an exemplary electrical circuit in the stack light of FIG. 2.

The power-converter/function module 14 includes an electrical circuit 56, where the electrical circuit 56 may include a power converter circuit 156 (see also FIG. 13), a function generation circuit, a control circuit, a communication interface 154, a microcontroller, a microprocessor 150, non-volatile memory 152, or a combination thereof. The electrical circuit 56 receives electrical power from connector 26b and may convert this electrical power with the power converter circuit 156 into a backbone voltage for use with the later beacon modules 12 and/or an audio alarm module 18. In this way beacon modules 12 and audio alarm modules 18 having common voltage parameters (e.g. the same voltage and the same voltage mode of either AC or DC) can be used with stack lights 10 receiving any operating voltage. In some embodiments, the power-converter/function module 14 and the base module 16 may be combined into a single module.

The electrical circuit 56 may also generate or transmit control signals for use by the later beacon modules 12 and/or an audio alarm module 18 to control operation. The electrical circuit 56 may provide for the ability to impose modulation functions such as lamp flashing or module sequencing on the later beacon modules 12 and audio alarm module 18 by modulating the power received by those modules. In various configurations, the electrical circuit 56 will receive operating electrical power and multiple signal lines through electrical connector 26*b* as derived from conductors 36. From this, the power converter/function electrical circuit 56 establishes a backbone ground reference on "common" conductor 68 and multiple signal voltages for control of beacon modules 12 or audio alarm module 18 on conductors 75*a*-75*c* (typically up to seven conductors although only three are shown for clarity in this example). The common conductor 68 and signal conductors 75 are connected to electrical connector 26*c*, for example, as depicted in right to left order of signal conductors 75*a*, 75*b*, 75*c* and common conductor 68.

Referring still to FIG. 2, connector 26*d* in subsequent beacon module 12*b*, may connect to connector 26*c* and may be attached, for example, to a printed circuit board 60 carrying on it multiple light emitting diodes (LEDs) 62. As shown, LEDs 62 are connected between common conductor 68 and signal conductor 75*a* occupying the extreme left and right positions of the connector 26*d*. Accordingly, power on the signal conductor 75*a* will energize the LEDs 62 of beacon module 12*b* so that the light may be viewed through translucent housing 15. The housing 15 may have a tint to provide a desired light color and/or the LEDs 62 may be selected for a desired color. Although the LEDs 62 are shown connected in parallel, series connections are also possible. Current-sharing resistances for each LED 62 have been omitted for clarity.

It will be understood then that beacon module 12*b* being constructed electrically and mechanically identical to beacon module 12*a* may then be attached to beacon module 12*a* in the same way that beacon module 12*a* was attached to the power-converter/function module 14 and that signal conductor 75*a* in the second beacon module 12*b* will be connected to signal conductor 75*b* in the first beacon module 12*a* such that that the second signal conductor 75*b* in the first beacon module will now be connected to the LEDs 62 in the second beacon module 12*b*.

The system illustrated for beacon module 12*a* and beacon module 12*b* may be continued to beacon module 12*c* (not depicted in FIG. 2) so that signal conductors 75*a*, 75*b*, and 75*c* will control the first, second and third beacon modules 12 according to their order in the stack and in a manner indifferent to the exact beacon module 12 and without the need for adjustment of the internal wiring of the beacon modules 12*a* or the setting of internal addresses or the like. The number of terminals in the connector 26 and signal conductors 75 determine the limit of the number of modules 12 that may be stacked in this manner.

Optionally, each beacon module 12 may include an electric circuit 80 configured to receive and distribute control signals on each circuit board 60. Referring, for example, to FIG. 4, each of the lower terminals 67 has an input signal 71 conducted on a trace between the lower terminal 67 and the electric circuit 80. Each of the upper terminals 63 has an output signal 73 conducted on a trace between the electric circuit 80 and the upper terminal 63. It is contemplated that the electric circuit 80 may be a series of traces, as illustrated in FIG. 2 to distribute control signals between terminals and LEDs 62 in the beacon module. Optionally, the electric circuit may include one or more discrete integrated circuits, such as logic chips, to receive the input signals 71 and generate output signals 73 according to the predefined logic. According to still another embodiment, the electric circuit 80 may include a communication interface where one or more of the input signals 71 are conductors for an industrial network. The communication interface may receive, for example, a data byte or data word in which one or more bits defines control of a particular module 12. Optionally, the communication interface may receive a data packet and extract control signals included in the payload of the data packet. According to yet another embodiment of the invention, the electric circuit 80 may include a processor and a non-volatile memory device. Instructions may be stored in the memory device for execution by the processor. The processor may receive the input signals 71 from the lower terminals and generate the output signals 73 and/or a control signal to each LED 62 according to the stored instructions.

Figure 5:
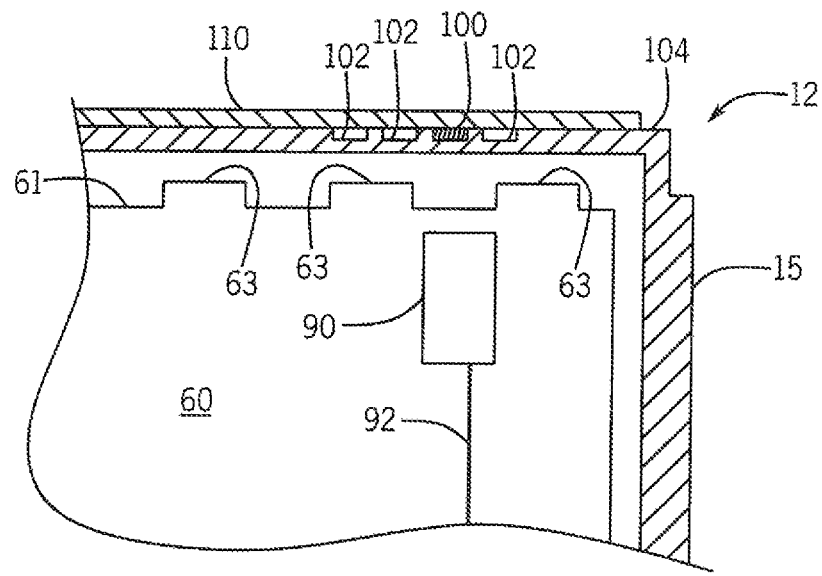
FIG. 5 is a partial sectional view of the beacon module of FIG. 4.
Figure 6:
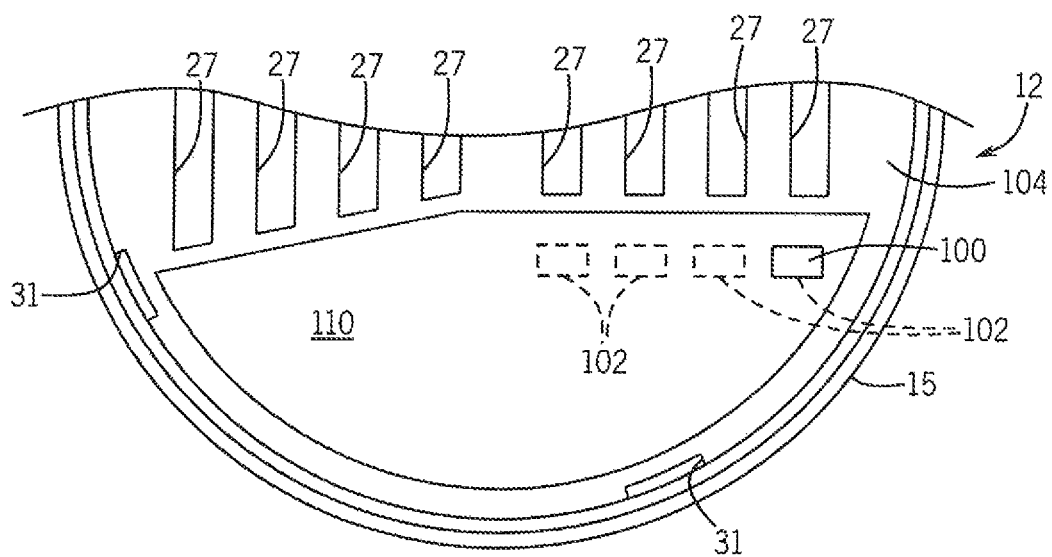
FIG. 6 is a partial top plan view of the beacon module of FIG. 4.

As previously indicated, the housing 15 for each beacon module 12 may be tinted to a different color. Similarly, audio modules 18 may be configured to generate different tones or sequences of tones. The control signals carried by signal conductors 75 may be generated by an external controller, such as a programmable logic controller, or be wired directly to switches, such as a proximity switch indicating an access gate is open or closed. The stack light 10 is configured such that a specific color or tone is intended to identify a particular operating condition. If a stack light 10 is assembled incorrectly, the stack light 10 may indicate the wrong operating condition, which may result in unnecessary maintenance or allow undesirable operation. Turning next to FIGS. 4-6, one embodiment of a system for detecting the order of assembly of modules in a stack light is disclosed.

According to the embodiment illustrated in FIGS. 4-6, a magnetic method of detecting the order of assembly of modules in a stack light is disclosed. A magnetic field sensor 90 is mounted on the circuit board 60. The magnetic field sensor 90 may be, for example, a Hall Effect sensor, a magneto-diode, an anisotropic magnetoresistive (AMR) device, a giant magnetoresistive (GMR) device, or other microelectromechanical (MEMS) device configured to generate an electrical signal corresponding to the presence of a magnetic field. The magnetic field sensor 90 outputs a feedback signal 92 to the electric circuit 80 corresponding to a magnetic field detected by the sensor.

According to the illustrated embodiment, the magnetic field detected by the sensor 90 is generated by a magnet 100 mounted on the housing 15 of the module 12. As illustrated in FIG. 4, a two-part label 110 is applied to the upper surface 104 of the housing 15. The label 110 includes identifying information for the module 12 that may be read by a technician installing or maintaining the stack light 10. The magnet 100 is mounted to one part 110*b* of the label and positioned within range of the magnetic field sensor 90. As a result, the magnetic field sensor 90 generates a signal corresponding to the presence of the magnet 100 on the label 110.

For manufacturing purposes, it is desirable to provide a single circuit board 60 that may be utilized in each of the different color beacon modules 12. Referring to FIGS. 5 and 6, the upper surface 104 of the housing 15 may include multiple cavities 102 integrally formed in the upper surface 104. Each cavity 102 is the same size and shape and is configured to receive the magnet 100. The cavities 102 are spaced apart in a line across the upper surface 104. Optionally, the cavities 102 may be arranged in other configurations, for example, in two rows or in a circular arrangement without deviating from the scope of the invention. The housings 15 for beacon modules 12 of each color include the same sets of cavities 102, and each location is assigned to one of the available colors of the housings 15. During assembly of a beacon module 12, a circuit board 60 is inserted into the housing 15 and a magnet 100 is inserted into one of the cavities 102, corresponding to the color of the housing 15. The magnet 100 may be retained via an adhesive, a press fit, or the like. The label 110 is placed over the cavities 102 and may further serve to retain the magnet 100 within the cavity 102. Based on the location of the magnet 100, the magnetic field sensor will detect a different magnetic field and generate a different feedback signal 92 corresponding to the detected field. The electric circuit 80 may be used to determine the color of the housing 15 or to pass the signal 92 to the electrical circuit 56 in a base module or to an external device, such as a PLC in communication with the stack light 10, to determine the color of the housing 15.

It is also contemplated that multiple magnets 100 may be mounted to one housing 15. Each cavity may act, for example, as a bit in a logical sequence. If the housing 15 includes four cavities 102, sixteen combinations of magnets 100 may be realized. The sensor 90 may be configured to generate a different signal for each combination of magnets 100, providing for detection of up to sixteen different modules 12 with four cavities 102.

According to another embodiment, the cavities 102 may be of a different size and/or shape. Each housing 15 may include a single cavity 102 in the same location but of a different size. The different size or shape of each cavity 102 may accommodate a different magnet 100. Different magnets 100 may generate magnetic fields having different strengths or distribution. As a result, the magnetic field sensor 90 generates different signals 92 corresponding to the detected field. Cavities 102 of different sizes hold magnets 100 having different magnetic field strengths, such that each different magnet 100 may be used by the electric circuit 80 in the module 12, the electrical circuit 56 in the base, or an external device to identify the module 12 on which the sensor 90 is mounted.

It is further contemplated that the magnetic sensor 90 may be used to also detect the type of module 12 in which sensor 90 is mounted. The number of available configurations of magnets 100 may exceed, for example, the number of different colors offered in the stack light 10. It is contemplated that two different magnet configurations may be used to identify the same color where one module 12 provides a solid lamp and the other module 12 provides a flashing lamp. Optionally, an audio module 18 may also include one or more magnets 100 mounted in one of the magnet configurations corresponding to an audio tone or sequence of audio tones output by the audio module 18. Thus, the magnetic field sensor 90 may be used to determine both color and function of a module 12.

Figure 8:
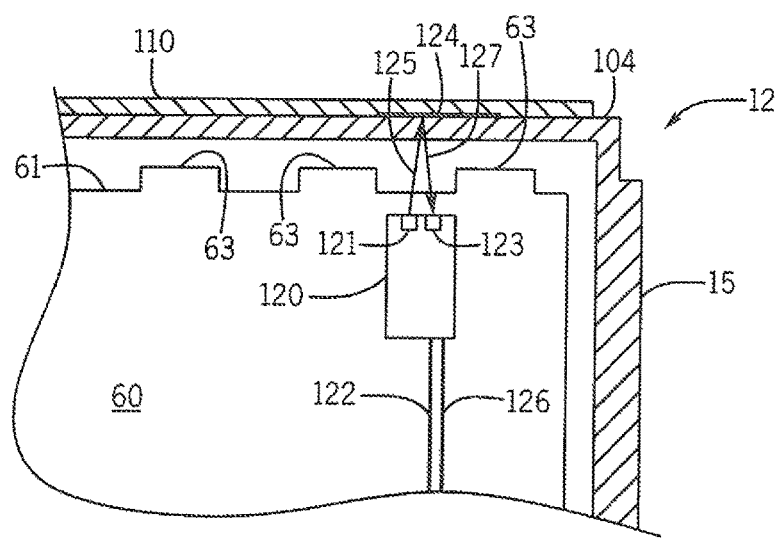
FIG. 8 is a partial sectional view of the beacon module of FIG. 7.
Figure 9:
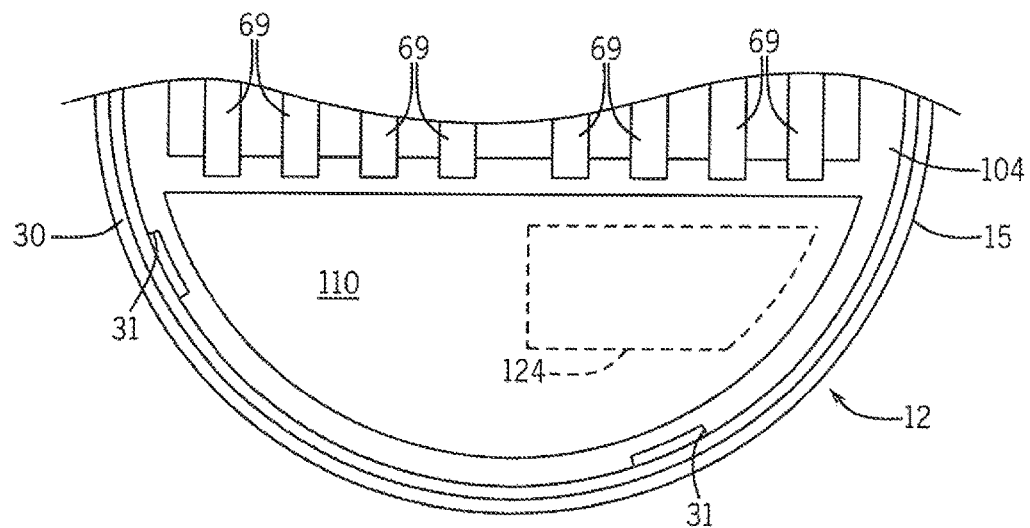
FIG. 9 is a partial top plan view of the beacon module of FIG. 7.

Turning next to FIGS. 7-9, another embodiment of the system for identifying modules utilizing an optical sensor 120 is illustrated. The optical sensor 120 is configured to detect different colors and generate a feedback signal 122 corresponding to the color detected. According to one embodiment of the invention, the optical sensor 120 is a transceiver including a transmitter 121 to emit light and a receiver 123 to detect light. One or more control signals 126 control operation of the optical sensor 120.

The optical sensor 120 may be configured to generate a pulse of light from the transmitter 121 and then detect the reflected light at the receiver 123. According to one embodiment, a target 124 is placed on a bottom surface of a label 110 applied to the housing 15. The target 124 may be a solid color such that the amount of light reflected back to the receiver varies as a function of the color on the target 124. As with the magnetic field sensor, a single circuit board 60 may be constructed with an optical sensor 120 mounted to the board, where the same circuit board 60 is installed into housings of beacon modules 12 having different colors. A different color target 124 may be assigned for each color of the housing 15, and the feedback signal 122 is different for each of the targets. Because each housing is a different color, the amount of light reflected is further a function of the color of the housing 15. However, the color of the target 124 may be selected in combination with the color of the housing 15 such that a predefined amount of light is reflected back to the receiver 123.

According to another embodiment of the invention, the target 124 may be a reflective surface to improve reflection of light from the target 124. The amount of light detected at the receiver 123 will vary only as a function of the color of the housing 15. According to still another embodiment, the optical sensor 120 may simply be directed at either a side wall or the top surface 104 of the housing 15 without having a target mounted to the housing 15. The translucent surface of the housing 15 will reflect a portion of the light directed toward it and the amount of light will vary as a function of the color of the housing 15.

Similar to the magnetic field sensor, it is contemplated that the optical sensor 120 may also be used to determine a function of the module 12. An audio module 18 may, for example, be a solid black module. The amount of light reflected from the audio module will be different than that reflected by a translucent housing of the beacon module 12. Optionally, a target having a color dedicated for the audio module 18 may be located on the inside of the audio module. The optical sensor 120 may detect the color for an audio module and generate the feedback signal 122 accordingly. The electric circuit 80 may be used to determine the color of the housing 15 or function of the module 12 or, alternately, to pass the feedback signal 122 to an external device, such as a PLC in communication with the stack light 10 to determine the color of the housing 15 or function of the module 12.

Figure 11:
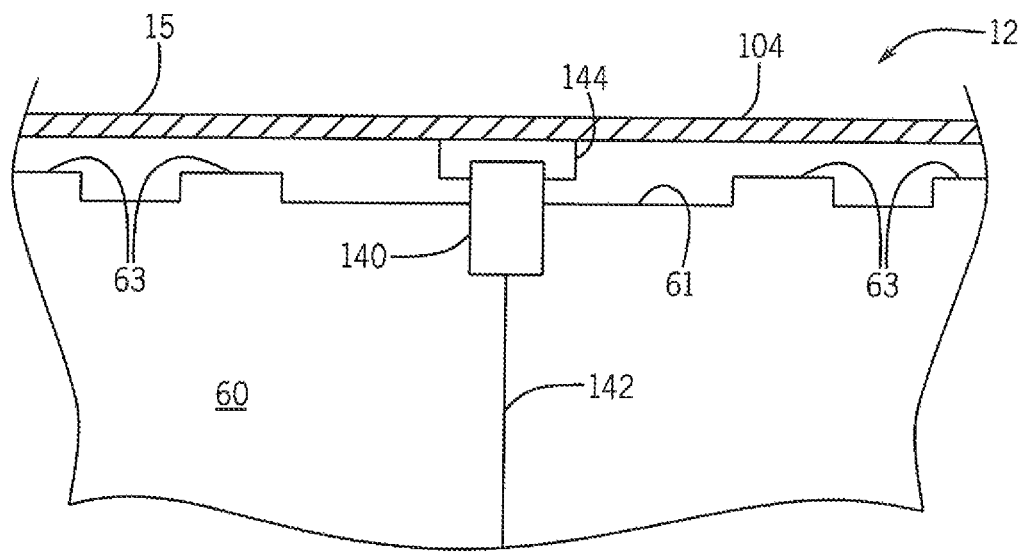
FIG. 11 is a partial sectional view of the beacon module of FIG. 10.
Figure 12:
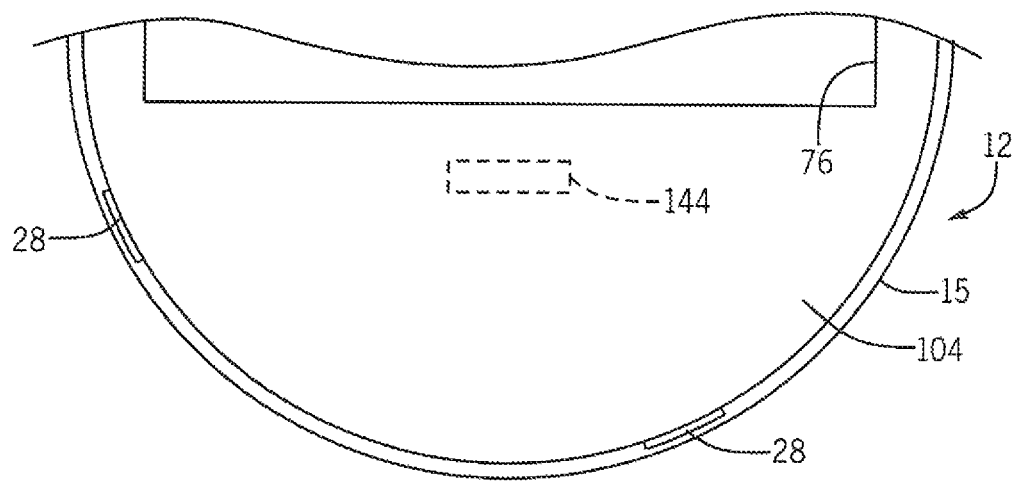
FIG. 12 is a partial top plan view of the beacon module of FIG. 10.

Turning next to FIGS. 10-12, another embodiment of the system for identifying modules utilizes an electrical connector 140 mounted to the circuit board 60 and an electrical device 144 mounted to the housing 15 to determine the color and/or function of the module in which the circuit board 60 has been inserted. According to the illustrated embodiment, a slot 76 extends the width of the upper surface 104 of the module 12 and the circuit board 60 is generally aligned with the slot to provide for electrical connection between modules. It is contemplated that the slot 76 may have a closed portion aligned with the electrical connector 140 on which the electrical device 144 may be mounted. Optionally and as illustrated, the electrical connector 140 may be mounted to one side of the circuit board 60 and the electrical device 144 mounted adjacent to the slot 76 and in alignment with the electrical connector 140.

As the circuit board 60 is inserted into the housing 15, the electrical connector 140 establishes an electrical connection with the electrical device 144. According to one embodiment of the invention, the electrical device 144 includes a resistive element and another connector complementary to the electrical connector 140 on the circuit board 60. When the circuit board is inserted into the housing 15, the electrical connector 140 on the circuit board 60 mates with the complementary connector on the electrical device 144 and, thereby the resistive element in the electrical device 144 is connected between terminals of the electrical connector 140 on the circuit board 60. A known voltage or current may be transmitted through the resistive element from a voltage source or current source, respectively, on the circuit board 60 or supplied from the power module 14 and the resulting current or voltage present across the terminals of the electrical connector 140 may be measured. The value of the resistive element may then be determined based on the applied and measured voltage and current across the electrical connector 140. Optionally, the electrical device 144 may include a reactive component such as a capacitor or an inductor. In still other embodiments, the electrical device 144 may include a resistive component and a reactive component. In each instance, a measured response to a predefined current or voltage applied across the electrical device 144 is compared to a set of expected responses within the electrical circuit 80. Based on the measured response, the electrical circuit 80 identifies which electrical device or devices 144 are present on the housing 15.

Different component values of the electrical device(s) 144 may be assigned to different modules. Each color of the housing 15 on a beacon module, for example, may be assigned a particular resistor, capacitor, or inductor value. Similarly, multiple component values may be assigned to a single color, where one value indicates the lamp will be constant and another value indicates the lamp will be flashing. Still other component values may be assigned to audio modules 18. The electrical circuit 80 on the circuit board 60 in each module may be configured to measure the resultant current or voltage based on the applied voltage or current. The electrical circuit 80 may further be configured to process the measured current or voltage to identify a particular color of the housing 15 or function of the module. Optionally, the current or voltage may be passed to the electrical circuit 56 in the base module 16 to identify each of the modules present in the stack light 10.

Figure 14:
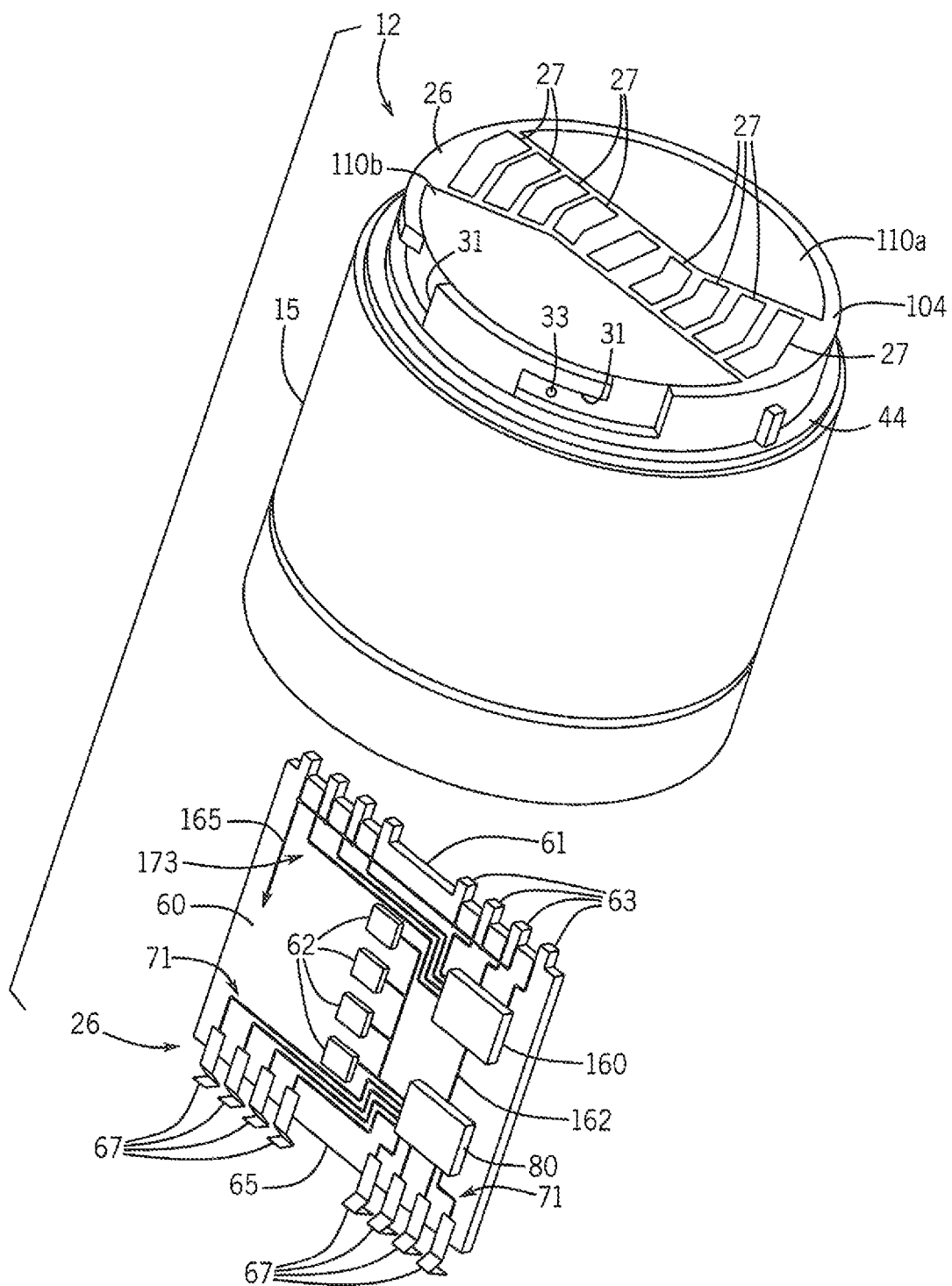
FIG. 14 is a partial exploded view of a beacon module for use in the stack light of FIG. 1 illustrating another embodiment of the system to identify the module.
Figure 15:
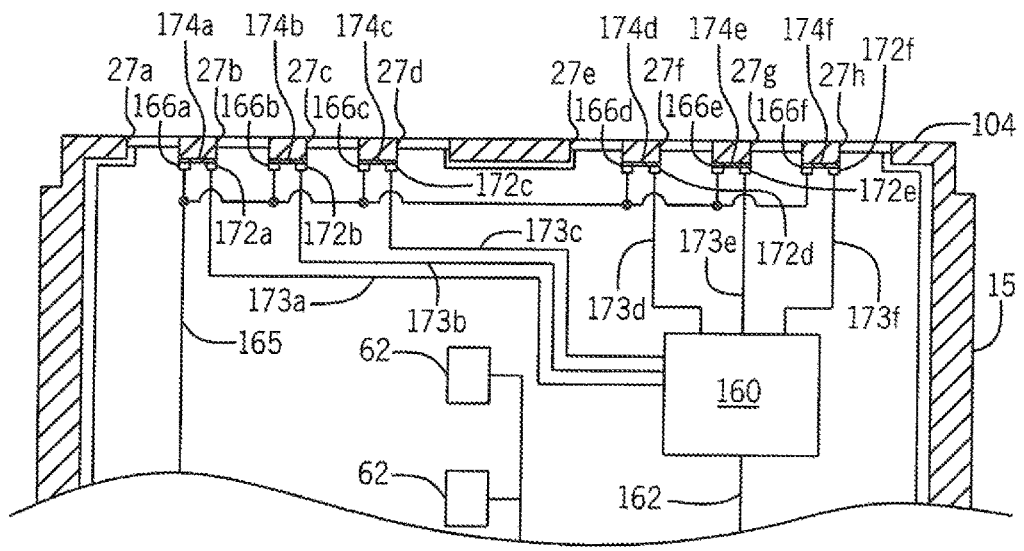
FIG. 15 is a partial sectional view of the beacon module of FIG. 14.
Figure 16:
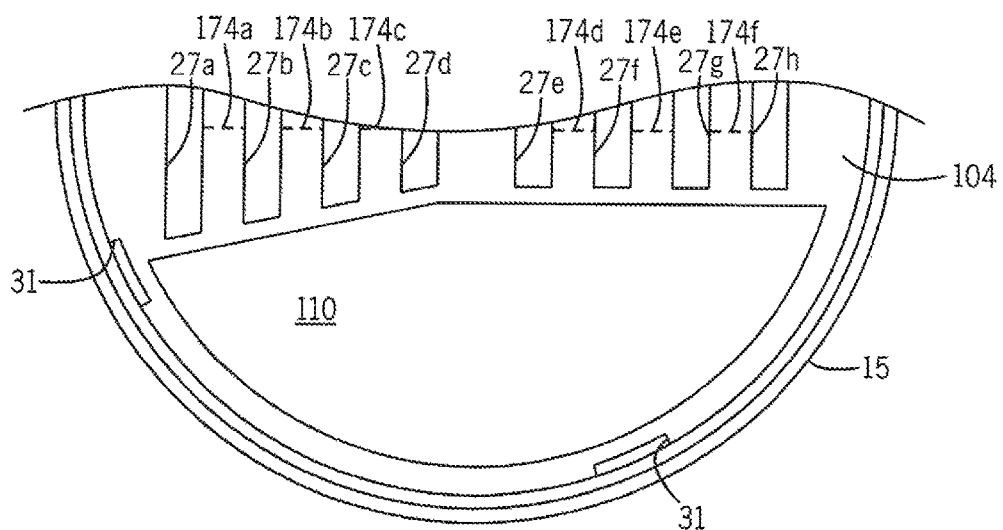
FIG. 16 is a partial top plan view of the beacon module of FIG. 14.

Turning next to FIGS. 14-16, another embodiment of the system for identifying modules utilizes a series of contacts and clips to determine the color and/or function of the module in which the circuit board 60 has been inserted. According to the illustrated embodiment, one or more clips 174 may be affixed to an inner surface of the housing between each slot 27 in the housing. The clip 174 may be, for example, a spring clip that is press fit on to the slot, a conductive tape adhered between slots or any other suitable conductive material affixed between slots. Two contacts 166, 172 are mounted along the top edge 61 of the circuit board for each clip 174. A first contact 166 receives a reference voltage or a reference current. The second contact 172 is normally open. If a clip 174 is present on the housing, the clip 174 establishes an electrical connection between the first contact 166 and the second contact 172. When the clip establishes the electrical connection, the reference voltage or reference current is provided as a signal 173 to a logic circuit 160. Optionally, the reference voltage or reference current may be provided directly to the electrical circuit 80.

During assembly, each housing 15 receives one or more clips 174 mounted to the interior of the housing between slots 27. The clips 174 may be arranged in a binary pattern to generate a binary number. According to the illustrated embodiment, providing up to six potential clips 174a-174f results in sixty-four possible binary combinations. Each color of the housing 15 on a beacon module, different functions of the beacon module, audio modules, and the like may each receive a unique identifier from the sixty-four possible combinations. The logic circuit 160 may be configured to combine the different signals into a single word, which is transmitted as a feedback signal 162 to the electrical circuit 80. Optionally, the logic circuit 160 may be configured to pass the signals 173a-173f received from each clip as a set of feedback signals 162 directly back to the electrical circuit 80 and the electrical circuit may be configured to identify a particular color of the housing 15 or function of the module. According to still another embodiment, the current or voltage may be passed to the electrical circuit 56 in the base module 16 to identify each of the modules present in the stack light 10.

As the circuit board 60 is inserted into the housing 15, each pair of contacts 166, 172 engage the clip 174, if present, on the housing 15. When the module is powered up, a reference voltage or current 165 is supplied to each of the first contacts 166a-166f. The reference voltage or current 165 is preferably supplied by an external power supply. In some embodiments, the module is configured to draw power from the signal lines configured to enable the LEDs 62 within the module. It is contemplated that an initial routine may be executed in which power is temporarily supplied to each of the signal lines, thereby illuminating and providing power to each module 12. During this initial sequence, the binary number generated by the external power applied to the housing and according to the clips 174 present may be read and the color and/or function of the module 12 may be determined. It is further contemplated that the clips 174 or conductive material may be located at other positions within the housing 15. For example, a channel may be integrally formed along the side of the housing 15, where the channel is configured to receive the circuit board 60 within the housing. A retaining member, such as a clip, stop, or the like may be used to position the circuit board 60 within the channel. A series of clips 174 or other conductive elements may be positioned along the channel and contacts positioned along the edge of the circuit board 60 to align with the clips 174 in a manner discussed above.

In operation, each stack light 10 may be configured to determine the identity of each module mounted in the stack. It is contemplated that a verification routine will execute on power up. The verification routine may be stored in a processor 150 in the electrical circuit 56 in the base module 16 or power-converter/function module 14. Optionally, individual verification routines may be stored in processors of the electrical circuits 80 on each module. In either instance, the verification routine generates a control signal or series of control signals to the sensor 90, 120, 140 in the module to identify the module in which it is mounted. The steps in the verification routine may vary as a function of the type of sensor 90, 120, 140 utilized by the modules.

If a magnetic field sensor 90 is utilized, the magnetic field sensor may be enabled, for example, by providing a known voltage or current to the sensor 90. An output of the sensor provides the feedback signal 92 corresponding to the magnitude of the electric field detected by the sensor 90. Optionally, certain magnetic field sensors 90 may also provide an indication of an angle at which the magnetic field is oriented with respect to the magnetic field sensor 90. The feedback signal 92 is passed back to one of the electrical circuits 56, 80 in the stack light 10 for further processing.

If an optical sensor 120 is utilized, the transmitter 121 for the sensor 120 is energized to emit a pulse of light. The pulse of light is oriented to reflect of the target 124, if present, or to reflect from the housing 15 back to the receiver 123. The receiver 123 then generates a feedback signal 122 corresponding to the amount of reflected light observed at the receiver 123. The feedback signal 122 is passed back to one of the electrical circuits 56, 80 in the stack light 10 for further processing.

If an electrical connector 140 is utilized as the sensor, a known current or voltage is supplied to the connector 140.

The resulting voltage or current across the connector 140 as a result of the resistive element is provided as a feedback signal 142 from the electrical connector 140. The feedback signal 142 is passed back to one of the electrical circuits 56, 80 in the stack light 10 for further processing.

If a series of contacts 166, 172 are provided as the sensor, the reference voltage or current is supplied to the first contact 166. For each clip 174, acting as a target, present on the housing 15, the circuit is completed between the first contact 166 and the second contact 172 and a signal 173 is provided to the logic circuit 160. The logic circuit, in turn, may combine the signals 173 from each set of contacts 166, 172 and generate the feedback signal 162 which is passed back to one of the electrical circuits 56, 80 in the stack light 10 for further processing.

Regardless of the type of sensor (90, 120, 140, or 166 and 172) utilized, the feedback signal (92, 122, 142, or 162) is utilized to identify the module in which the sensor is located. According to one embodiment, the microprocessor 150 in the electrical circuit 56 of the base module receives the feedback signals from each of the modules in the stack light 10. The feedback signal is compared to stored values in the non-volatile memory 152 to identify each module. For example, with a magnetic field sensor 90 the strength of the magnetic field detected for a green housing has a predefined value and the strength of the magnetic field detected for an amber housing has another predefined value. The microprocessor compares the feedback signal 92 to determine the strength of the magnetic field measured at each module and identifies the color of the housing 15 for the beacon module 12. Similarly, if the feedback signal 92 corresponds to a function, such as flashing or steady, or to an audio module, the microprocessor 150 identifies the function as well as a color. The identity of each module may be stored in the non-volatile memory for later use.

Optionally, if each module is executing the verification routine, the electric circuit 80 in the module may include a processor and non-volatile memory storing a table of expected values for the feedback signals (92, 122, 142, 162). In the same manner as described above for the base module, each of the individual modules may identify the color and/or function of the corresponding module. The identity of each module may be stored in the non-volatile memory for later use.

Having identified the color and/or function of each module in the stack light 10, the information may be utilized by a controller in communication with the stack light 10 to verify correct assembly. The stack light 10 may be connected, for example, to a PLC controlling a machine or process on which the stack light 10 is mounted. The PLC polls the data stored in the stack light 10 to determine how the stack light 10 has been assembled. During development of the control program, an expected order of assembly may have been defined. The PLC compares the expected order of assembly to the stored information and verifies that the stack light 10 has been properly assembled. If an error in the order of assembly is detected, the PLC may generate a warning or fault message to alert the operator to the error and may further inhibit operation of the controlled machine or process until the order of the stack light 10 has been corrected.

According to still another embodiment, the control program in the PLC may initially be configured to illuminate, for example, the green module or the amber module in a stack light without having prior knowledge of the arrangement of the modules within the light. At start-up, the PLC may retrieve the stored information and assign each of the modules a position within the stack light in accordance with the order in which the stack light 10 was assembled. The automated detection allows a control program to be generated for a PLC without having prior knowledge of the arrangement of the stack light. Further, modules may easily be added or removed from a stack light where the control program will need to only be modified for those modules being added or removed. Other modules may change order within the stack light 10 and the autodetection of the ordering of the modules allows the control program to illuminate the correct module.

It is contemplated that by mounting a sensor (90, 120, 140, or 166 and 172) to a circuit board inserted within a housing and a sensed component to the housing that the same circuit board may be utilized for different modules. In beacon modules 12, each of the LEDs 62 on the circuit board may be configured to emit white light. The color of the module is a result of the color of the housing 15. Thus, the circuit board 60 is identical for different color beacon modules. By mounting a target (100, 124, 144, 174) to or using the housing 15 itself as a target, the sensor may identify the color of the housing 15. Although a different circuit board may be required for an audio module 18, or a power-converter/function module 14, utilizing the same sensing method in these modules as implemented for the beacon modules 12 allows the PLC to verify assembly of other modules included within the stack light 10.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It should also be understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A system for identifying a module in a stack light, wherein the stack light includes at least a first module and a second module, the system comprising:
   a first sensor mounted within a first housing of the first module;
   a first target mounted to the first housing, wherein the first sensor is configured to detect the first target and to generate a first signal identifying the first module responsive to detecting the first target;

a second sensor mounted within a second housing of the second module, wherein the first sensor and the second sensor are the same type of sensor; and a second target mounted to the second housing, wherein the second sensor is configured to detect the second target and to generate a second signal identifying the second module responsive to detecting the second target, and wherein the second target is different than the first target such that the second signal is different than the first signal.

2. The system of claim 1 further comprising:

a first circuit board including a first electrical circuit in communication with the first sensor, wherein the first sensor is mounted to the first circuit board; and a second circuit board including a second electrical circuit in communication with the second sensor, wherein the second sensor is mounted to the second circuit board, and wherein a layout of the first circuit board is the same as a layout of the second circuit board.

3. The system of claim 2 wherein:

the first sensor is configured to detect a magnetic field, the first signal is generated responsive to a first magnetic field generated by the first target, the second sensor is configured to detect a magnetic field, the second signal is generated responsive to a second magnetic field generated by the second target, and the second magnetic field is different than the first magnetic field.

4. The system of claim 3 wherein:

the first electrical circuit receives the first signal and identifies the first module responsive to the first signal, and the second electrical circuit receives the second signal and identifies the second module responsive to the second signal.

5. The system of claim 3 wherein the first target is a first magnet, the second target is a second magnet, and the first and second magnets are identical to each other, the system further comprising:

a first set of cavities defined in an upper surface of the first housing;

a second set of cavities defined in an upper surface of the second housing, wherein the first and second set of cavities are identically arranged on their respective housing;

a first label configured to overlay the first set of cavities and to be mounted to the upper surface of the first housing; and a second label configured to overlay the second set of cavities and to be mounted to the upper surface of the second housing, wherein the first magnet is placed in a first cavity, selected from the first set of cavities, the second magnet is placed in a second cavity, selected from the second set of cavities, and the first cavity and second cavities are different cavities in their respective sets.

6. The system of claim 3 wherein the first target is a first magnet, the second target is a second magnet, and the first magnet generates a different magnetic field than the second magnet.

7. The system of claim 2 wherein:

the first sensor is configured to detect a color;

the first signal is generated responsive to a first color present on the first target;

the second sensor is configured to detect a color;

the second signal is generated responsive to a second color present on the second target; and the second color is different than the first color.

8. The system of claim 7 wherein:

the first target is the first housing;

the second target is the second housing;

the first sensor emits a first light beam to the first housing and detects a first reflected light beam off the first housing, and the second sensor emits a second light beam to the second housing and detects a second reflected light beam off the second housing.

9. The system of claim 7 further comprising:

a first label having a first side oriented away from the first housing and a second side configured to be mounted to the first housing, wherein the first target includes the first color and is on the second side of the first label;

a second label having a first side oriented away from the second housing and a second side configured to be mounted to the second housing, wherein the second target includes the second color and is on the second side of the second label, wherein:

the first sensor emits a first light beam through the first housing to the first target and detects a first reflected light beam off the first target, and the second sensor emits a second light beam through the second housing to the second target and detects a second reflected light beam off the second target.

10. The system of claim 2 wherein:

the first sensor is a first electrical connector;

the first target is a first electrical device;

the first signal is generated responsive to the first electrical connector establishing an electrical connection with the first electrical device;

the second sensor is a second electrical connector;

the second target is a second electrical device;

the second signal is generated responsive to the second electrical connector establishing an electrical connection with the second electrical device; and the second electrical device is different than the first electrical device.

11. The system of claim 10 wherein:

the first electrical device is a first resistive element with a third electrical connector, wherein the third electrical connector is complementary to the first electrical connector to establish an electrical connection between the first resistive element and the first circuit board, and the second electrical device is a second resistive element with a fourth electrical connector, wherein the fourth electrical connector is complementary to the second electrical connector to establish an electrical connection between the second resistive element and the second circuit board.

12. The system of claim 2 wherein:

the first sensor is a plurality of contact pairs mounted on the first circuit board;

the first target is a plurality of electrically conductive strips on the first housing;

the first signal is generated responsive to each electrically conductive strip on the first housing establishing an electrical connection between a first contact and a second contact in one of the plurality of contact pairs mounted on the first circuit board;

the second sensor is a plurality of contact pairs mounted on the second circuit board;

the second target is a plurality of electrically conductive strips on the second housing;
the second signal is generated responsive to each electrically conductive strip on the second housing establishing an electrical connection between a first contact and a second contact in one of the plurality of contact pairs mounted on the second circuit board; and
the plurality of electrically conductive strips on the first housing are different than the plurality of electrically conductive strips on the second housing.

13. The system of claim 12 wherein:
the plurality of electrically conductive strips on the first housing define a first binary pattern, and
the plurality of electrically conductive strips on the second housing define a second binary pattern different than the first pattern.

14. A method of identifying a module in a stack light, wherein the stack light includes at least a first module and a second module, the method comprising the steps of:
detecting a first target mounted to the first housing with a first sensor, wherein the first sensor is mounted within the first housing;
generating a first signal identifying the first module with the first sensor responsive to detecting the first target;
detecting a second target mounted to the second housing with a second sensor, wherein the second sensor is mounted within the second housing; and
generating a second signal identifying the second module with the second sensor responsive to detecting the second target, wherein the second target is different than the first target such that the second signal is different than the first signal.

15. The method of claim 14 wherein:
the first sensor is mounted to a first circuit board,
the first circuit board is mounted within the first housing and includes a first electrical circuit in communication with the first sensor,
the second sensor is mounted to a second circuit board,
the second circuit board is mounted within the second housing and includes a second electrical circuit in communication with the second sensor, and
a layout of the first circuit board is the same as a layout of the second circuit board.

16. The method of claim 15 wherein:
the first sensor is configured to detect a magnetic field,
the first signal is generated responsive to a first magnetic field generated by the first target,
the second sensor is configured to detect a magnetic field,
the second signal is generated responsive to a second magnetic field generated by the second target, and
the second magnetic field is different than the first magnetic field.

17. The method of claim 15 wherein:
the first and second sensors are each configured to detect a color,
the step of detecting a first target further comprises the steps of transmitting a light at the first target and receiving a reflected light from the first target at the first sensor,
the first signal is generated responsive to a first color present on the first target,
the step of detecting a second target further comprises the steps of transmitting a light at the second target and receiving a reflected light from the second target at the second sensor,
the second signal is generated responsive to a second color present on the second target, and
the second color is different than the first color.

18. The method of claim 15 wherein:
the first and second sensors are each configured to detect a color,
the step of detecting a first target further comprises the steps of transmitting a light at the first housing and receiving a reflected light from the first housing at the first sensor,
the first signal is generated responsive to a first color of the first housing,
the step of detecting a second target further comprises the steps of transmitting a light at the second housing and receiving a reflected light from the second housing at the second sensor,
the second signal is generated responsive to a second color of the second housing, and
the second color is different than the first color.

19. The method of claim 15 wherein:
the first sensor is a first electrical connector;
the first target is a first electrical device;
the step of detecting the first target further comprises the steps of:
establishing an electrical connection between the first electrical connector and the first electrical device when the circuit board is mounted within the first housing,
passing one of a known voltage and a known current through the first electrical device, and
measuring one of a voltage and a current present on the first electrical device;
the second sensor is a second electrical connector;
the second target is a second electrical device;
the step of detecting the second target further comprises the steps of:
establishing an electrical connection between the second electrical connector and the second electrical device when the circuit board is mounted within the second housing,
passing one of a known voltage and a known current through the second electrical device, and
measuring one of a voltage and a current present on the second electrical device; and
the second electrical device is different that the first electrical device.

20. The method of claim 15 further comprising an initial step of providing power to the stack light and after the first and second signals are generated, the method further comprises the step of transmitting the first and second signals to a controller in communication with the stack light.

21. The method of claim 15 wherein:
the first sensor is a plurality of contact pairs mounted on the first circuit board
the first signal is generated responsive to a plurality of electrically conductive strips mounted on the first housing, wherein each electrically conductive strip establishes and electrical connection between a first contact and a second contact in one of the plurality of contact pairs;
the second sensor is a plurality of contact pairs mounted on the second circuit board; and
the second signal is generated responsive to a plurality of electrically conductive strips mounted on the first housing, wherein each electrically conductive strip establishes and electrical connection between a first contact and a second contact in one of the plurality of contact pairs.

22. A system for identifying a module in a stack light, wherein the stack light includes a first beacon module, a second beacon module, and a base module, the system comprising:
  a first sensor mounted within a first housing of the first module;
  a first circuit board including a first electrical circuit in communication with the first sensor, wherein the first sensor is mounted to the first circuit board;
  a first target mounted to the first housing, wherein the first sensor is configured to detect the first target and to generate a first signal identifying the first module responsive to detecting the first target;
  a second sensor mounted within a second housing of the second module, wherein the first sensor and the second sensor are the same type of sensor;
  a second circuit board including a second electrical circuit in communication with the second sensor, wherein the second sensor is mounted to the second circuit board;
  a second target mounted to the second housing, wherein the second sensor is configured to detect the second target and to generate a second signal identifying the second module responsive to detecting the second target, and wherein the second target is different than the first target such that the second signal is different than the first signal;
  a non-volatile memory device in the base module configured to store a plurality of instructions and to store an identity of each of the first and second beacon modules; and
  a microprocessor in the base module configured to execute the plurality of instructions to control the first and second sensors to identify the first and second modules.

23. The system of claim 22 wherein the microprocessor is configured to identify the first and second modules at power up and is further configured to transmit the identity of each of the first and second modules to a remote processor.

* * * * *